United States Patent
Chen

(10) Patent No.: US 10,374,642 B2
(45) Date of Patent: Aug. 6, 2019

(54) POWER LINE COMMUNICATION METHOD AND DEVICE

(71) Applicant: Huawei Technologies Co., Ltd., Shenzhen, Guangdong (CN)

(72) Inventor: Wei Chen, Wuhan (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/555,939

(22) PCT Filed: Mar. 6, 2015

(86) PCT No.: PCT/CN2015/073785
§ 371 (c)(1),
(2) Date: Sep. 5, 2017

(87) PCT Pub. No.: WO2016/141512
PCT Pub. Date: Sep. 15, 2016

(65) Prior Publication Data
US 2018/0048338 A1    Feb. 15, 2018

(51) Int. Cl.
| H04L 12/66 | (2006.01) |
| H04B 1/04 | (2006.01) |
| H04B 3/56 | (2006.01) |
| H03M 1/66 | (2006.01) |
| H04B 3/54 | (2006.01) |

(52) U.S. Cl.
CPC ............. *H04B 1/04* (2013.01); *H03M 1/66* (2013.01); *H04B 3/54* (2013.01); *H04B 3/56* (2013.01); *H04B 2203/5408* (2013.01); *H04B 2203/5454* (2013.01)

(58) Field of Classification Search
CPC ...................................................... H04B 1/04
See application file for complete search history.

(56) References Cited

U.S. PATENT DOCUMENTS

| 2003/0185027 A1 | 10/2003 | Yokoo et al. | |
| 2005/0180406 A1* | 8/2005 | Sagiv | H04M 1/2473 370/353 |
| 2006/0268770 A1* | 11/2006 | Spiess | H04W 84/18 370/328 |

(Continued)

FOREIGN PATENT DOCUMENTS

| CN | 101860495 A | 10/2010 |
| CN | 101917313 A | 12/2010 |
| EP | 1343253 A1 | 9/2003 |

*Primary Examiner* — Gerald A Smarth

(57) ABSTRACT

Embodiments of the present invention disclose a power line communications device, and the power line communications device includes a USB interface, a protocol conversion module, a signal conversion module, a coupler, and a power line interface. A first end of the USB interface is connected to a first end of the protocol conversion module, a second end of the protocol conversion module is connected to a first end of the signal conversion module, a second end of the signal conversion module is connected to a first end of the coupler, and a second end of the coupler is connected to a first end of the power line interface. During implementation of the embodiments of the present invention, the USB interface may be used to provide a network signal for a terminal device.

13 Claims, 7 Drawing Sheets

(56) References Cited

U.S. PATENT DOCUMENTS

| | | | | |
|---|---|---|---|---|
| 2007/0183543 A1* | 8/2007 | Lu | ............................ | H04B 3/54 |
| | | | | 375/346 |
| 2008/0285684 A1* | 11/2008 | Shen | ...................... | H03D 3/007 |
| | | | | 375/324 |
| 2012/0319854 A1* | 12/2012 | Maruyama | ............. | G01R 31/04 |
| | | | | 340/635 |
| 2013/0066400 A1* | 3/2013 | Perryman | .......... | A61N 1/37229 |
| | | | | 607/59 |

* cited by examiner

POWER LINE COMMUNICATION METHOD AND DEVICE

CROSS-REFERENCE TO RELATED APPLICATIONS

This application is a National Stage of International Application No. PCT/CN2015/073785, filed Mar. 6, 2015, which is hereby incorporated by reference in its entirety.

TECHNICAL FIELD

The present invention relates to the field of communications technologies, and in particular, to a power line communication method and device.

BACKGROUND

A power line communications technology refers to a communication manner in which a power line is used to transmit data and a media signal. According to the technology, a signal is loaded into a current, then the current is sent to a power line communications device by using the power line, and the power line communications device separates the signal that is loaded into the current from the current and sends the signal to a terminal device. However, an existing power line communications device can send a separated signal to a terminal device only by using a network cable or in a WiFi signal manner, and cannot send the separated signal to the terminal device by using a USB interface.

SUMMARY

Embodiments of the present invention disclose a power line communication method and device, so as to provide a network signal for a terminal device by using a USB interface.

A first aspect of the embodiments of the present invention discloses a power line communications device, including a USB interface, a protocol conversion module, a first signal conversion module, a coupler, and a power line interface, where a first end of the USB interface is connected to a first end of the protocol conversion module, a second end of the protocol conversion module is connected to a first end of the first signal conversion module, a second end of the first signal conversion module is connected to a first end of the coupler, and a second end of the coupler is connected to a first end of the power line interface;

the power line interface is configured to: connect to a power line, receive a first electrical signal sent by the power line, and send the first electrical signal to the coupler;

the coupler is configured to: obtain a second electrical signal from the first electrical signal, and send the second electrical signal to the first signal conversion module, where the second electrical signal is an electrical signal in a preset frequency band;

the first signal conversion module is configured to: convert the second electrical signal into a first network signal, and send the first network signal to the protocol conversion module;

the protocol conversion module is configured to: convert the first network signal of an Ethernet protocol into a first network signal of a USB protocol, and send the converted first network signal to the USB interface; and the USB interface is configured to: connect to a terminal device by using a data cable, and send the converted first network signal to the terminal device, so as to trigger the terminal device to access a network by using the converted first network signal.

With reference to the first aspect of the embodiments of the present invention, in a first possible implementation manner of the first aspect of the embodiments of the present invention, the power line communications device further includes a second signal conversion module, where a first end of the second signal conversion module is connected to the second end of the first signal conversion module, and a second end of the second signal conversion module is connected to the first end of the coupler; and the second signal conversion module is configured to: receive the second electrical signal sent by the coupler, convert the second electrical signal from an analog signal into a digital signal, and send the converted second electrical signal to the first signal conversion module.

With reference to the first possible implementation manner of the first aspect of the embodiments of the present invention, in a second possible implementation manner of the first aspect of the embodiments of the present invention, the USB interface is further configured to: receive a second network signal sent by the terminal device by using the data cable, and send the second network signal to the protocol conversion module;

the protocol conversion module is further configured to: convert the second network signal of the USB protocol into a second network signal of the Ethernet protocol, and send the converted second network signal to the first signal conversion module;

the first signal conversion module is further configured to: convert the converted second network signal into a third electrical signal, and send the third electrical signal to the second signal conversion module;

the second signal conversion module is further configured to: convert the third electrical signal from a digital signal into an analog signal, and send the converted third electrical signal to the coupler;

the coupler is further configured to send the converted third electrical signal to the power line interface; and the power line interface is further configured to send the converted third electrical signal to the power line.

With reference to the second possible implementation manner of the first aspect of the embodiments of the present invention, in a third possible implementation manner of the first aspect of the embodiments of the present invention, the power line communications device further includes an amplifier, where a first end of the amplifier is connected to a third end of the second signal conversion module, and a second end of the amplifier is connected to a third end of the coupler; and the amplifier is configured to: receive the converted third electrical signal sent by the second signal conversion module, amplify the converted third electrical signal, and send the amplified third electrical signal to the coupler.

With reference to any one of the first aspect of the embodiments of the present invention, or the first to the third possible implementation manners of the first aspect of the embodiments of the present invention, in a fourth possible implementation manner of the first aspect of the embodiments of the present invention, the power line communications device further includes a power supply module, where a first end of the power supply module is connected to a second end of the power line interface, and a second end of the power supply module is connected to a second end of the USB interface;

the power supply module is configured to: receive the first electrical signal sent by the power line interface, and send the first electrical signal to the USB interface; and the USB interface is further configured to send the first electrical signal to the terminal device by using the data cable, so as to trigger the terminal device to be charged by using the first electrical signal.

A second aspect of the embodiments of the present invention discloses a power line communications device, including a USB interface, a protocol conversion module, a first signal conversion module, a coupler, and a power line interface, where a first end of the USB interface is connected to a first end of the protocol conversion module, a second end of the protocol conversion module is connected to a first end of the first signal conversion module, a second end of the first signal conversion module is connected to a first end of the coupler, and a second end of the coupler is connected to a first end of the power line interface;

the USB interface is configured to: connect to a terminal device by using a data cable, receive a first network signal sent by the terminal device, and send the first network signal to the protocol conversion module;

the protocol conversion module is configured to: convert the first network signal of a USB protocol into a first network signal of an Ethernet protocol, and send the converted first network signal to the first signal conversion module;

the first signal conversion module is configured to: convert the converted first network signal into a first electrical signal, and send the first electrical signal to the coupler;

the coupler is configured to send the first electrical signal to the power line interface; and the power line interface is configured to: connect to a power line, and send the first electrical signal to the power line.

With reference to the second aspect of the embodiments of the present invention, in a first possible implementation manner of the second aspect of the embodiments of the present invention, the power line communications device further includes a second signal conversion module, where a first end of the second signal conversion module is connected to the second end of the first signal conversion module, and a second end of the second signal conversion module is connected to the first end of the coupler; and the second signal conversion module is configured to: receive the first electrical signal sent by the first signal conversion module, convert the first electrical signal from a digital signal into an analog signal, and send the converted first electrical signal to the coupler.

With reference to the first possible implementation manner of the second aspect of the embodiments of the present invention, in a second possible implementation manner of the second aspect of the embodiments of the present invention, the power line communications device further includes an amplifier, where a first end of the amplifier is connected to a third end of the second signal conversion module, and a second end of the amplifier is connected to a third end of the coupler; and the amplifier is configured to: receive the converted first electrical signal sent by the second signal conversion module, amplify the converted first electrical signal, and send the amplified first electrical signal to the coupler.

With reference to either of the first or the second possible implementation manner of the second aspect of the embodiments of the present invention, in a third possible implementation manner of the second aspect of the embodiments of the present invention, the power line interface is further configured to: receive a second electrical signal sent by the power line, and send the second electrical signal to the coupler;

the coupler is further configured to: obtain a third electrical signal from the second electrical signal, and send the third electrical signal to the second signal conversion module, where the third electrical signal is an electrical signal in a preset frequency band;

the second signal conversion module is further configured to: convert the third electrical signal from an analog signal into a digital signal, and send the converted third electrical signal to the first signal conversion module;

the first signal conversion module is further configured to: convert the converted third electrical signal into a second network signal, and send the second network signal to the protocol conversion module;

the protocol conversion module is further configured to convert the second network signal of the Ethernet protocol into a second network signal of the USB protocol, and send the converted second network signal to the USB interface; and the USB interface is further configured to send the second network signal of the USB protocol to the terminal device, so as to trigger the terminal device to access a network by using the second network signal of the USB protocol.

With reference to the third possible implementation manner of the second aspect of the embodiments of the present invention, in a fourth possible implementation manner of the second aspect of the embodiments of the present invention, the power line communications device further includes a power supply module, where a first end of the power supply module is connected to a second end of the power line interface, and a second end of the power supply module is connected to a second end of the USB interface;

the power supply module is configured to: receive a second electrical signal sent by the power line interface, and send the second electrical signal to the USB interface; and the USB interface is further configured to send the second electrical signal to the terminal device by using the data cable, so as to trigger the terminal device to be charged by using the second electrical signal.

A third aspect of the embodiments of the present invention discloses a power line communication method, including:

receiving a first electrical signal sent by a power line;

obtaining, from the first electrical signal, a second electrical signal in a preset frequency band;

converting the second electrical signal into a first network signal;

converting the first network signal of an Ethernet protocol into a first network signal of a USB protocol; and sending the first network signal of the USB protocol to the terminal device, so as to trigger the terminal device to access a network by using the first network signal of the USB protocol.

With reference to the third aspect of the embodiments of the present invention, in a first possible implementation manner of the third aspect of the embodiments of the present invention, after the obtaining, from the first electrical signal, a second electrical signal in a preset frequency band, and before the converting the second electrical signal into a first network signal, the method further includes:

performing an analog-to-digital conversion on the second electrical signal; and the converting the second electrical signal into a first network signal includes:

converting a converted second electrical signal into the first network signal.

With reference to the first possible implementation manner of the third aspect of the embodiments of the present invention, in a second possible implementation manner of the third aspect of the embodiments of the present invention, the method further includes:

receiving a second network signal sent by the terminal device;

converting the second network signal of the USB protocol into a second network signal of the Ethernet protocol;

converting the second network signal of the Ethernet protocol into a third electrical signal;

performing a digital-to-analog conversion on the third electrical signal; and sending a converted third electrical signal to the power line.

With reference to the second possible implementation manner of the third aspect of the embodiments of the present invention, in a third possible implementation manner of the third aspect of the embodiments of the present invention, after the performing a digital-to-analog conversion on the third electrical signal, and before the sending a converted third electrical signal to the power line, the method further includes:

amplifying the converted third electrical signal; and the sending a converted third electrical signal to the power line includes:

sending the amplified third electrical signal to the power line.

With reference to any one of the third aspect of the embodiments of the present invention, or the first to the third possible implementation manners of the third aspect of the embodiments of the present invention, in a fourth possible implementation manner of the third aspect of the embodiments of the present invention, the method further includes:

sending the first electrical signal to the terminal device, so as to trigger the terminal device to be charged by using the first electrical signal.

A fourth aspect of the embodiments of the present invention discloses a communication method, including:

receiving a first network signal sent by a terminal device;

converting the first network signal of a USB protocol into a first network signal of an Ethernet protocol;

converting the first network signal of the Ethernet protocol into a first electrical signal; and sending the first electrical signal to a power line.

With reference to the fourth aspect of the embodiments of the present invention, in a first possible implementation manner of the fourth aspect of the embodiments of the present invention, after the converting the first network signal of the Ethernet protocol into a first electrical signal, and before the sending the first electrical signal to a power line, the method further includes:

performing a digital-to-analog conversion on the first electrical signal; and the sending the first electrical signal to a power line includes:

sending a converted first electrical signal to the power line.

With reference to the first possible implementation manner of the fourth aspect of the embodiments of the present invention, in a second possible implementation manner of the fourth aspect of the embodiments of the present invention, after the performing a digital-to-analog conversion on the first electrical signal, and before the sending a converted first electrical signal to the power line, the method further includes:

amplifying the converted first electrical signal; and the sending a converted first electrical signal to the power line includes:

sending the amplified first electrical signal to the power line.

With reference to either of the first or the second possible implementation manner of the fourth aspect of the embodiments of the present invention, in a third possible implementation manner of the fourth aspect of the embodiments of the present invention, the method further includes:

receiving a second electrical signal sent by the power line;

obtaining, from the second electrical signal, a third electrical signal in a preset frequency band;

performing an analog-to-digital conversion on the third electrical signal;

converting a converted third electrical signal into a second network signal;

converting the second network signal of the Ethernet protocol into a second network signal of the USB protocol; and sending the second network signal of the USB protocol to the terminal device, so as to trigger the terminal device to access a network by using the second network signal of the USB protocol.

With reference to the third possible implementation manner of the fourth aspect of the embodiments of the present invention, in a fourth possible implementation manner of the fourth aspect of the embodiments of the present invention, the method further includes:

sending the second electrical signal to the terminal device, so as to trigger the terminal device to be charged by using the second electrical signal.

In the embodiments of the present invention, the power line communications device includes a USB interface, a network signal of a USB protocol sent by a terminal device maybe received, the network signal of the USB protocol is converted into a network signal of an Ethernet protocol, then the network signal of the Ethernet protocol is converted into an electrical signal, and the electrical signal is sent to a power line, that is, the network signal that is sent by the terminal device and received by using the USB interface may be converted into the electrical signal, and the electrical signal is sent to the power line; and/or an electrical signal sent by the power line may be received, the electrical signal is converted into a network signal of the Ethernet protocol, then the network signal of the Ethernet protocol is converted into a network signal of the USB protocol, and the network signal of the USB protocol is sent to the terminal device by using the USB interface, that is, the received electrical signal sent by the power line may be converted into the network signal of the USB protocol, and the network signal of the USB protocol is sent to the terminal device by using the USB interface.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Embodiments of the present invention disclose a power line communications device, so as to provide a network signal for a terminal device by using a USB interface. Details are separately illustrated in the following.

Figure 1:
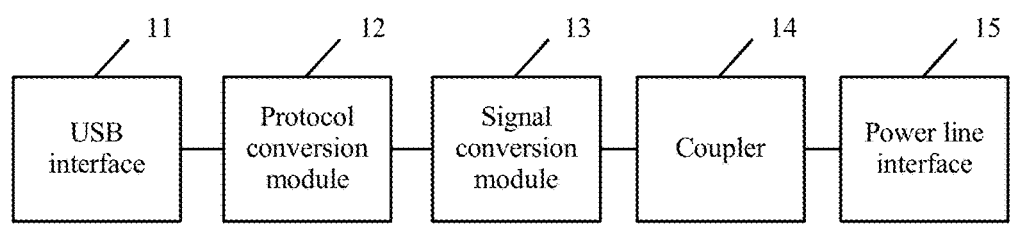
FIG. 1 is a structural diagram of a power line communications device according to an embodiment of the present invention.

Referring to FIG. 1, FIG. 1 is a structural diagram of a power line communications device according to an embodiment of the present invention. As shown in FIG. 1, the power line communications device may include a USB interface 11, a protocol conversion module 12, a signal conversion module 13, a coupler 14, and a power line interface 15.

A first end of the USB interface 11 is connected to a first end of the protocol conversion module 12, a second end of the protocol conversion module 12 is connected to a first end of the signal conversion module 13, a second end of the signal conversion module 13 is connected to a first end of the coupler 14, and a second end of the coupler 14 is connected to a first end of the power line interface 15.

The power line interface 15 is configured to: connect to a power line, receive a first electrical signal sent by the power line, and send the first electrical signal to the coupler 14.

The coupler 14 is configured to: obtain a second electrical signal from the first electrical signal, and send the second electrical signal to the signal conversion module 13, where the second electrical signal is an electrical signal in a preset frequency band.

The signal conversion module 13 is configured to: convert the second electrical signal into a network signal, and send the network signal to the protocol conversion module 12.

The protocol conversion module 12 is configured to: convert the network signal of an Ethernet protocol into a network signal of a USB protocol, and send the converted network signal to the USB interface 11.

The USB interface 11 is configured to: connect to a terminal device by using a data cable, and send the converted network signal to the terminal device, so as to trigger the terminal device to access a network by using the converted network signal.

In this embodiment, the power line communications device is connected to a power line by using a power line interface, to implement power line communication. For example, when the power line interface is a plug, the power line may be connected by plugging the plug into a socket, and a terminal device is connected to a USB interface of the power line communications device by using a data cable. When a user needs to access a network by using the terminal device, the user may enable a function, of the terminal device, for accessing a network by using the power line communications device. The power line sends an electrical signal to the power line interface; the power line interface sends the electrical signal to a coupler; the coupler obtains, from the electrical signal, an electrical signal in a preset frequency band, and sends the obtained electrical signal to a signal conversion module; the signal conversion module converts the obtained electrical signal into a network signal, and sends the network signal to a protocol conversion module; the protocol conversion module converts the network signal of an Ethernet protocol into a network signal of a USB protocol, and sends the network signal of the USB protocol to the USB interface; and the USB interface sends the network signal of the USB protocol to the terminal device by using the data cable, so as to trigger the terminal device to access the network by using the network signal of the USB protocol. The protocol conversion module may be a TRL8153 chip.

According to the power line communications device described in FIG. 1, the power line communications device includes a USB interface, an electrical signal sent by a power line maybe received, the electrical signal is converted into a network signal of an Ethernet protocol, and then the network signal is converted from the Ethernet protocol into a USB protocol, so that the power line communications device sends the network signal to a connected terminal device by using the USB interface. That is, the received electrical signal sent by the power line may be converted into the network signal of the USB protocol, and the network signal of the USB protocol is sent to the terminal device by using the USB interface.

Figure 2:
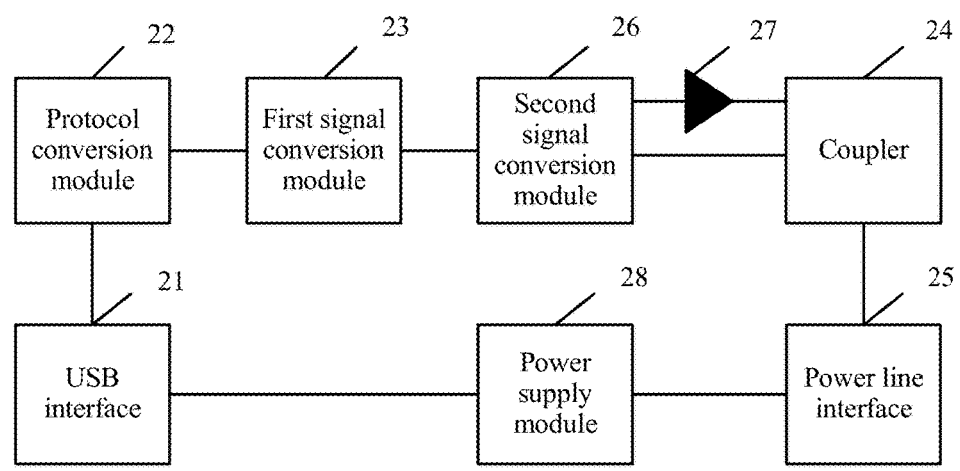
FIG. 2 is a structural diagram of another power line communications device according to an embodiment of the present invention.

Referring to FIG. 2, FIG. 2 is a structural diagram of another power line communications device according to an embodiment of the present invention. As shown in FIG. 2, the power line communications device may include a USB interface 21, a protocol conversion module 22, a first signal conversion module 23, a coupler 24, and a power line interface 25.

A first end of the USB interface 21 is connected to a first end of the protocol conversion module 22, a second end of the protocol conversion module 22 is connected to a first end of the first signal conversion module 23, a second end of the first signal conversion module 23 is connected to a first end of the coupler 24, and a second end of the coupler 24 is connected to a first end of the power line interface 25.

The power line interface 25 is configured to: connect to a power line, receive a first electrical signal sent by the power line, and send the first electrical signal to the coupler 24.

The coupler 24 is configured to: obtain a second electrical signal from the first electrical signal, and send the second electrical signal to the first signal conversion module 23, where the second electrical signal is an electrical signal in a preset frequency band.

The first signal conversion module 23 is configured to: convert the second electrical signal into a first network signal, and send the first network signal to the protocol conversion module 22.

The protocol conversion module 22 is configured to: convert the first network signal of an Ethernet protocol into a first network signal of a USB protocol, and send the converted first network signal to the USB interface 21.

The USB interface 21 is configured to: connect to a terminal device by using a data cable, and send the converted first network signal to the terminal device, so as to trigger the terminal device to access a network by using the converted first network signal.

In a possible implementation manner, the power line communications device may further include a second signal conversion module 26.

A first end of the second signal conversion module 26 is connected to the second end of the first signal conversion module 23, and a second end of the second signal conversion module 26 is connected to the first end of the coupler 24.

The second signal conversion module 26 is configured to: receive the second electrical signal sent by the coupler 24, convert the second electrical signal from an analog signal into a digital signal, and send the converted second electrical signal to the first signal conversion module 23.

In a possible implementation manner, the USB interface 21 is further configured to: receive a second network signal sent by the terminal device by using the data cable, and send the second network signal to the protocol conversion module 22.

The protocol conversion module 22 is further configured to: convert the second network signal of the USB protocol into a second network signal of the Ethernet protocol, and send the converted second network signal to the first signal conversion module 23.

The first signal conversion module 23 is further configured to: convert the converted second network signal into a third electrical signal, and send the third electrical signal to the second signal conversion module 26.

The second signal conversion module 26 is further configured to: convert the third electrical signal from a digital signal into an analog signal, and send the converted third electrical signal to the coupler 24.

The coupler 24 is further configured to send the converted third electrical signal to the power line interface 25.

The power line interface 25 is further configured to send the converted third electrical signal to the power line.

In a possible implementation manner, the power line communications device may further include an amplifier 27.

A first end of the amplifier 27 is connected to a third end of the second signal conversion module 26, and a second end of the amplifier 27 is connected to a third end of the coupler 24.

The amplifier 27 is configured to: receive the converted third electrical signal sent by the second signal conversion module 26, amplify the converted third electrical signal, and send the amplified third electrical signal to the coupler 24.

In a possible implementation manner, the power line communications device may further include a power supply module 28.

A first end of the power supply module 28 is connected to a second end of the power line interface 25, and a second end of the power supply module 28 is connected to a second end of the USB interface 21.

The power supply module 28 is configured to: receive the first electrical signal sent by the power line interface 25, and send the first electrical signal to the USB interface 21.

The USB interface 21 is further configured to send the first electrical signal to the terminal device by using the data cable, so as to trigger the terminal device to be charged by using the first electrical signal.

In this embodiment, the power line communications device is connected to a power line by using a power line interface. For example, when the power line interface is a plug, the power line may be connected by plugging the plug into a socket, and a terminal device is connected to a USB interface of the power line communications device by using a data cable. The power line communications device not only can send the terminal device a signal sent by the power line, but also can send the power line a signal sent by the terminal device. When a user needs to access a network by using the terminal device, the user may enable a function, of the terminal device, for accessing a network by using the power line communications device. The power line sends an analog electrical signal to the power line interface; the power line interface sends the analog electrical signal to a coupler; the coupler obtains, from the analog electrical signal, an analog electrical signal in a preset frequency band, and sends the obtained analog electrical signal to a second signal conversion module; the second signal conversion module converts the obtained analog electrical signal into a digital electrical signal, and sends the digital electrical signal to a first signal conversion module; the first signal conversion module converts the digital electrical signal into a network signal of an Ethernet protocol, and sends the network signal of the Ethernet protocol to a protocol conversion module; the protocol conversion module converts the network signal of the Ethernet protocol into a network signal of a USB protocol, and sends the network signal of the USB protocol to the USB interface; and the USB interface sends the network signal of the USB protocol to the terminal device by using the data cable, so as to trigger the terminal device to access the network by using the network signal of the USB protocol. When the user needs to share a network by using the terminal device, the user may enable a function, of the terminal device, for sharing a network by using the power line communications device. The terminal device sends a network signal to the USB interface by using the data cable; the USB interface sends the network signal to the protocol conversion module; the protocol conversion module converts the network signal of the USB protocol into a network signal of the Ethernet protocol, and sends the network signal of the Ethernet protocol to the first signal conversion module; the first signal conversion module converts the network signal of the Ethernet protocol into a digital electrical signal, and sends the digital electrical signal to the second signal conversion module; the second signal conversion module converts the digital electrical signal into an analog electrical signal, and sends the analog electrical signal to an amplifier; the amplifier amplifies the analog electrical signal and sends the amplified analog electrical signal to the coupler; and the coupler loads the amplified analog electrical signal into the power line by using the power line interface. The power line communications device further has a charger function. The power line interface may further send a power supply module the electrical signal sent by the power line, the power supply module sends the electrical signal to the USB interface, and the USB interface sends the electrical signal to the terminal device, so as to trigger the terminal device to charge a battery by using the electrical signal.

According to the power line communications device described in FIG. 2, the power line communications device includes a USB interface, an electrical signal sent by a power line maybe received, the electrical signal is converted into a network signal of an Ethernet protocol, and then the network signal is converted from the Ethernet protocol into a USB protocol, so that the power line communications device sends the network signal to a connected terminal device by using the USB interface. That is, the received electrical signal sent by the power line may be converted into the network signal of the USB protocol, and the network signal of the USB protocol is sent to the terminal device by using the USB interface.

In an embodiment, as shown in FIG. 1, the power line communications device may include a USB interface 11, a protocol conversion module 12, a signal conversion module 13, a coupler 14, and a power line interface 15.

A first end of the USB interface 11 is connected to a first end of the protocol conversion module 12, a second end of the protocol conversion module 12 is connected to a first end of the signal conversion module 13, a second end of the signal conversion module 13 is connected to a first end of the coupler 14, and a second end of the coupler 14 is connected to a first end of the power line interface 15.

The USB interface 11 is configured to: connect to a terminal device by using a data cable, receive a network signal sent by the terminal device, and send the network signal to the protocol conversion module 12.

The protocol conversion module 12 is configured to: convert the network signal of a USB protocol into a network signal of an Ethernet protocol, and send the converted network signal to the signal conversion module 13.

The signal conversion module 13 is configured to: convert the converted network signal into an electrical signal, and send the electrical signal to the coupler 14.

The coupler 14 is configured to send the electrical signal to the power line interface 15.

The power line interface 15 is configured to: connect to a power line, and send the electrical signal to the power line.

In this embodiment, the power line communications device is connected to a power line by using a power line interface. For example, when the power line interface is a plug, the power line may be connected by plugging the plug into a socket, and a terminal device is connected to a USB interface of the power line communications device by using a data cable. When a user needs to share a network by using the terminal device, the user may enable a function, of the terminal device, for sharing a network by using the power line communications device. The terminal device sends a network signal to the USB interface by using the data cable; the USB interface sends the network signal to a protocol conversion module; the protocol conversion module converts the network signal of a USB protocol into a network signal of an Ethernet protocol, and sends the network signal of the Ethernet protocol to a signal conversion module; the signal conversion module converts the network signal of the Ethernet protocol into an electrical signal, and sends the electrical signal to a coupler; the coupler sends the electrical signal to a power line interface; and the power line interface sends the electrical signal to the power line.

In this embodiment, the power line communications device includes a USB interface, a network signal of a USB protocol sent by a terminal device may be received, the network signal of the USB protocol is converted into a network signal of an Ethernet protocol, then the network signal of the Ethernet protocol is converted into an electrical signal, and the electrical signal is sent to a power line. That is, the network signal that is sent by the terminal device and received by using the USB interface may be converted into the electrical signal, and the electrical signal is sent to the power line.

In another embodiment, as shown in FIG. 2, the power line communications device may include a USB interface 21, a protocol conversion module 22, a first signal conversion module 23, a coupler 24, and a power line interface 25.

A first end of the USB interface 21 is connected to a first end of the protocol conversion module 22, a second end of the protocol conversion module 22 is connected to a first end of the first signal conversion module 23, a second end of the first signal conversion module 23 is connected to a first end of the coupler 24, and a second end of the coupler 24 is connected to a first end of the power line interface 25.

The USB interface 21 is configured to: connect to a terminal device by using a data cable, receive a first network signal sent by the terminal device, and send the first network signal to the protocol conversion module 22.

The protocol conversion module 22 is configured to: convert the first network signal of a USB protocol into a first network signal of an Ethernet protocol, and send the converted first network signal to the first signal conversion module 23.

The first signal conversion module 23 is configured to: convert the converted first network signal into a first electrical signal, and send the first electrical signal to the coupler 24.

The coupler 24 is configured to send the first electrical signal to the power line interface 25.

The power line interface 25 is configured to: connect to a power line, and send the first electrical signal to the power line.

In a possible implementation manner, the power line communications device may further include a second signal conversion module 26.

A first end of the second signal conversion module 26 is connected to the second end of the first signal conversion module 23, and a second end of the second signal conversion module 26 is connected to the first end of the coupler 24.

The second signal conversion module 26 is configured to: receive the first electrical signal sent by the first signal conversion module 23, convert the first electrical signal from a digital signal into an analog signal, and send the converted first electrical signal to the coupler 24.

In a possible implementation manner, the power line communications device may further include an amplifier 27.

A first end of the amplifier 27 is connected to a third end of the second signal conversion module 26, and a second end of the amplifier 27 is connected to a third end of the coupler 24.

The amplifier 27 is configured to: receive the converted first electrical signal sent by the second signal conversion module 26, amplify the converted first electrical signal, and send the amplified first electrical signal to the coupler 24.

In a possible implementation manner, the power line interface 25 is further configured to: receive a second electrical signal sent by the power line, and send the second electrical signal to the coupler 24.

The coupler 24 is further configured to: obtain a third electrical signal from the second electrical signal, and send the third electrical signal to the second signal conversion module 26, where the third electrical signal is an electrical signal in a preset frequency band.

The second signal conversion module 26 is further configured to: convert the third electrical signal from an analog signal into a digital signal, and send the converted third electrical signal to the first signal conversion module 23.

The first signal conversion module 23 is further configured to: convert the converted third electrical signal into a second network signal, and send the second network signal to the protocol conversion module 22.

The protocol conversion module 22 is further configured to convert the second network signal of the Ethernet protocol into a second network signal of the USB protocol, and send the converted second network signal to the USB interface 21.

The USB interface 21 is further configured to send the second network signal of the USB protocol to the terminal device, so as to trigger the terminal device to access a network by using the second network signal of the USB protocol.

In a possible implementation manner, the power line communications device may further include a power supply module 28.

A first end of the power supply module 28 is connected to a second end of the power line interface 25, and a second end of the power supply module 28 is connected to a second end of the USB interface 21.

The power supply module 28 is configured to: receive a second electrical signal sent by the power line interface 25, and send the second electrical signal to the USB interface 21.

The USB interface 21 is further configured to send the second electrical signal to the terminal device by using the data cable, so as to trigger the terminal device to be charged by using the second electrical signal.

In this embodiment, the power line communications device is connected to a power line by using a power line interface. For example, when the power line interface is a plug, the power line may be connected by plugging the plug into a socket, and a terminal device is connected to a USB interface of the power line communications device by using a data cable. The power line communications device not only can send the terminal device a signal sent by the power line, but also can send the power line a signal sent by the terminal device. When a user needs to share a network by using the terminal device, the user may enable a function, of the terminal device, for sharing a network by using the power line communications device. The terminal device sends a network signal to the USB interface by using the data cable; the USB interface sends the network signal to a protocol conversion module; the protocol conversion module converts the network signal of a USB protocol into a network signal of an Ethernet protocol, and sends the network signal of the Ethernet protocol to a first signal conversion module; the first signal conversion module converts the network signal of the Ethernet protocol into a digital electrical signal, and sends the digital electrical signal to a second signal conversion module; the second signal conversion module converts the digital electrical signal into an analog electrical signal, and sends the analog electrical signal to an amplifier; the amplifier amplifies the analog electrical signal and sends the amplified analog electrical signal to a coupler; and the coupler loads the amplified analog electrical signal into the power line by using the power line interface. When the user needs to access a network by using the terminal device, the user may enable a function, of the terminal device, for accessing a network by using the power line communications device. The power line sends an analog electrical signal to the power line interface; the power line interface sends the analog electrical signal to the coupler; the coupler obtains, from the analog electrical signal, an analog electrical signal in a preset frequency band, and sends the obtained analog electrical signal to the second signal conversion module; the second signal conversion module converts the obtained analog electrical signal into a digital electrical signal, and sends the digital electrical signal to the first signal conversion module; the first signal conversion module converts the digital electrical signal into a network signal of the Ethernet protocol, and sends the network signal of the Ethernet protocol to the protocol conversion module; the protocol conversion module converts the network signal of the Ethernet protocol into a network signal of the USB protocol, and sends the network signal of the USB protocol to the USB interface; and the USB interface sends the network signal of the USB protocol to the terminal device by using the data cable, so as to trigger the terminal device to access the network by using the network signal of the USB protocol. The power line communications device further has a charger function. The power line interface may further send a power supply module the electrical signal sent by the power line, the power supply module sends the electrical signal to the USB interface, and the USB interface sends the electrical signal to the terminal device, so as to trigger the terminal device to charge a battery by using the electrical signal.

In this embodiment, the power line communications device includes a USB interface, a network signal of a USB protocol sent by a terminal device may be received, the network signal of the USB protocol is converted into a network signal of an Ethernet protocol, then the network signal of the Ethernet protocol is converted into an electrical signal, and the electrical signal is sent to a power line. That is, the network signal that is sent by the terminal device and received by using the USB interface may be converted into the electrical signal, and the electrical signal is sent to the power line.

Figure 3:
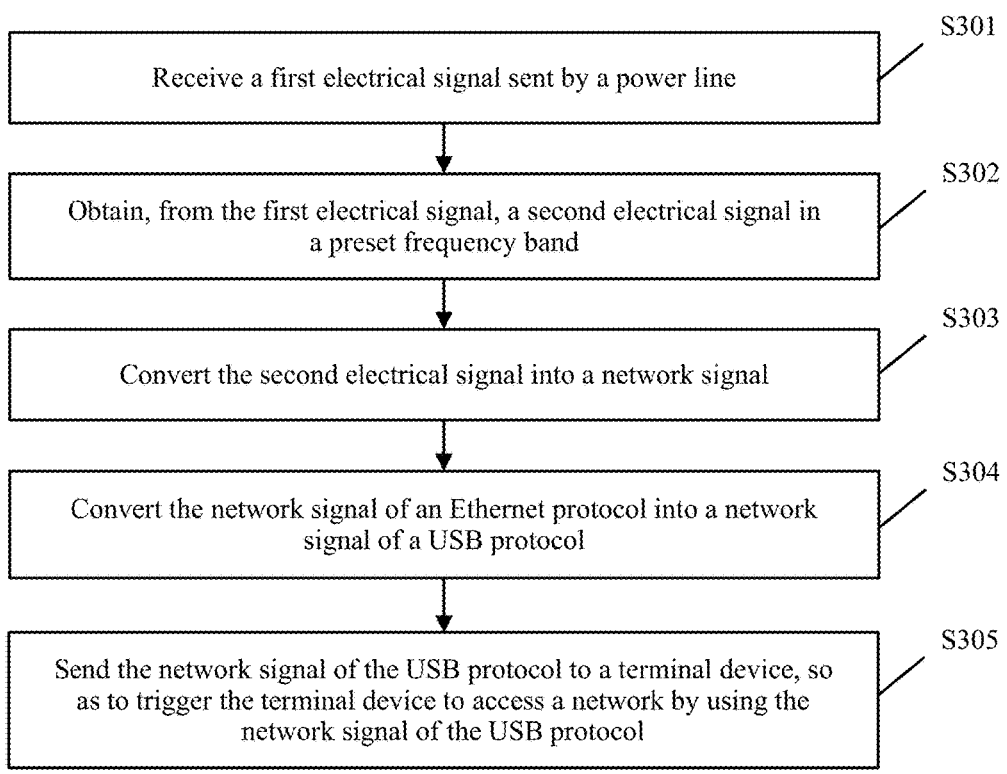
FIG. 3 is a flowchart of a power line communication method according to an embodiment of the present invention.

Referring to FIG. 3, FIG. 3 is a flowchart of a power line communication method according to an embodiment of the present invention. The power line communication method is applicable to a power line communications device, such as a power line communication modem. As shown in FIG. 3, the power line communication method may include the following steps.

S301. Receive a first electrical signal sent by a power line.

In this embodiment, the power line communications device is connected to the power line by using a socket or in another manner, the power line communications device is provided with a USB interface, and the USB interface is connected to a terminal device by using a data cable. When a user needs to access a network by using the terminal device, the user may enable a function, of the terminal device, for accessing a network by using the power line communications device, and the power line communications device receives the first electrical signal sent by the power line.

S302. Obtain, from the first electrical signal, a second electrical signal in a preset frequency band.

In this embodiment, the second electrical signal in the preset frequency band is loaded into the first electrical signal, and therefore the second electrical signal in the preset frequency band is obtained from the first electrical signal after the first electrical signal is received.

S303. Convert the second electrical signal into a network signal.

In this embodiment, after the second electrical signal is obtained, the second electrical signal is converted into the network signal of an Ethernet protocol.

S304. Convert the network signal of an Ethernet protocol into a network signal of a USB protocol.

In this embodiment, the power line communications device is connected to the terminal device by using the USB interface, and the USB interface can only transmit a network signal of the USB protocol, but cannot transmit a network signal of the Ethernet protocol. Therefore, the network signal of the Ethernet protocol is converted into the network signal of the USB protocol.

S305. Send the network signal of the USB protocol to a terminal device, so as to trigger the terminal device to access a network by using the network signal of the USB protocol.

In this embodiment, after the network signal of the USB protocol is obtained, the network signal of the USB protocol is sent to the terminal device by using the USB interface, so that the terminal device can access the network by using the network signal.

In the power line communication method described in FIG. 3, an electrical signal sent by a power line may be received, an electrical signal in a preset frequency band is obtained from the electrical signal, the electrical signal is converted into a network signal of an Ethernet protocol, then the network signal of the Ethernet protocol is converted into a network signal of a USB protocol, and the network signal of the USB protocol is sent to a terminal device. That is, the received electrical signal sent by the power line may be converted into the network signal of the USB protocol, and the network signal of the USB protocol is sent to the terminal device by using a USB interface.

Figure 4A:
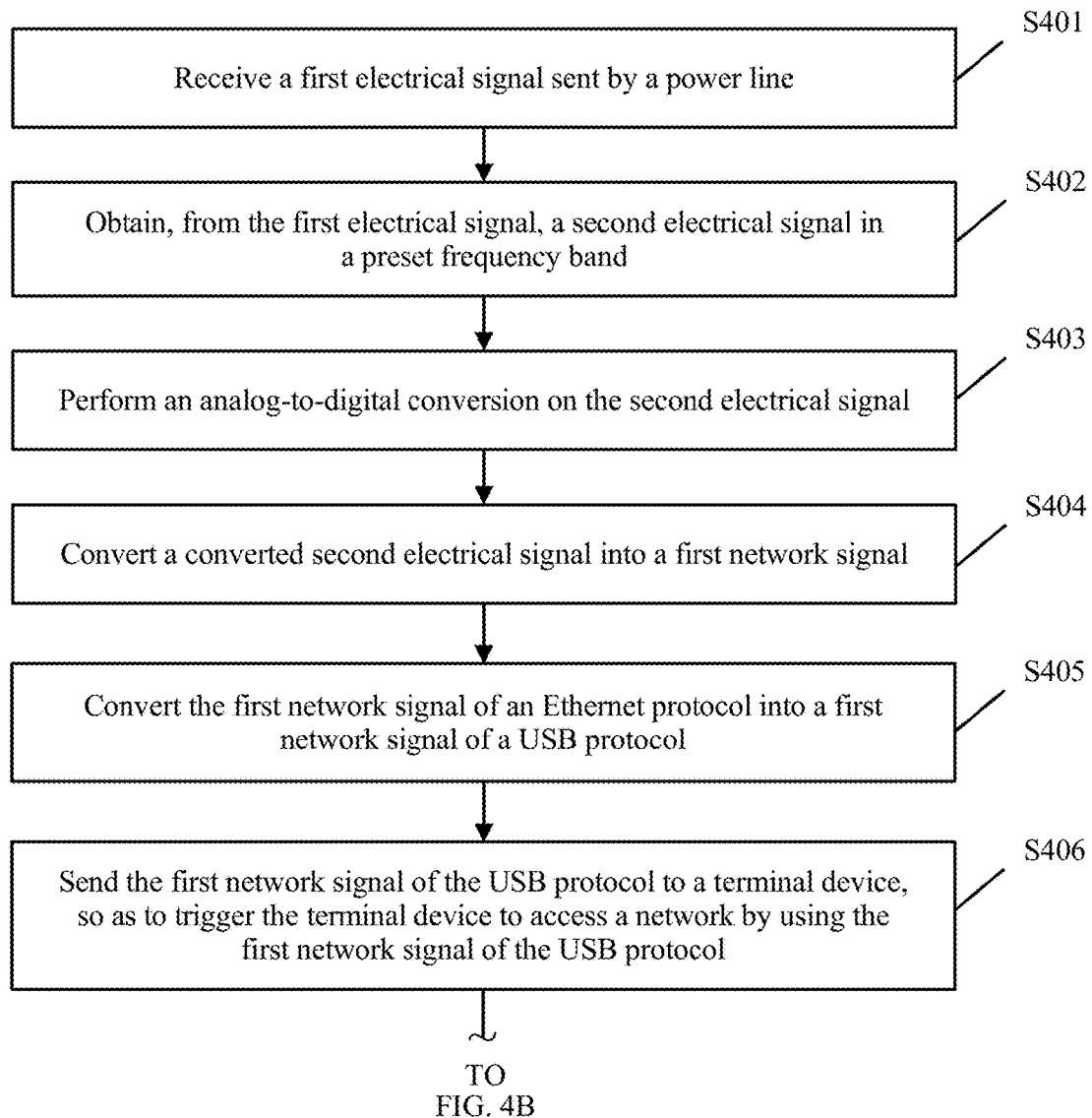
FIG. 4A and FIG. 4B are a flowchart of another power line communication method according to an embodiment of the present invention.
Figure 4B:
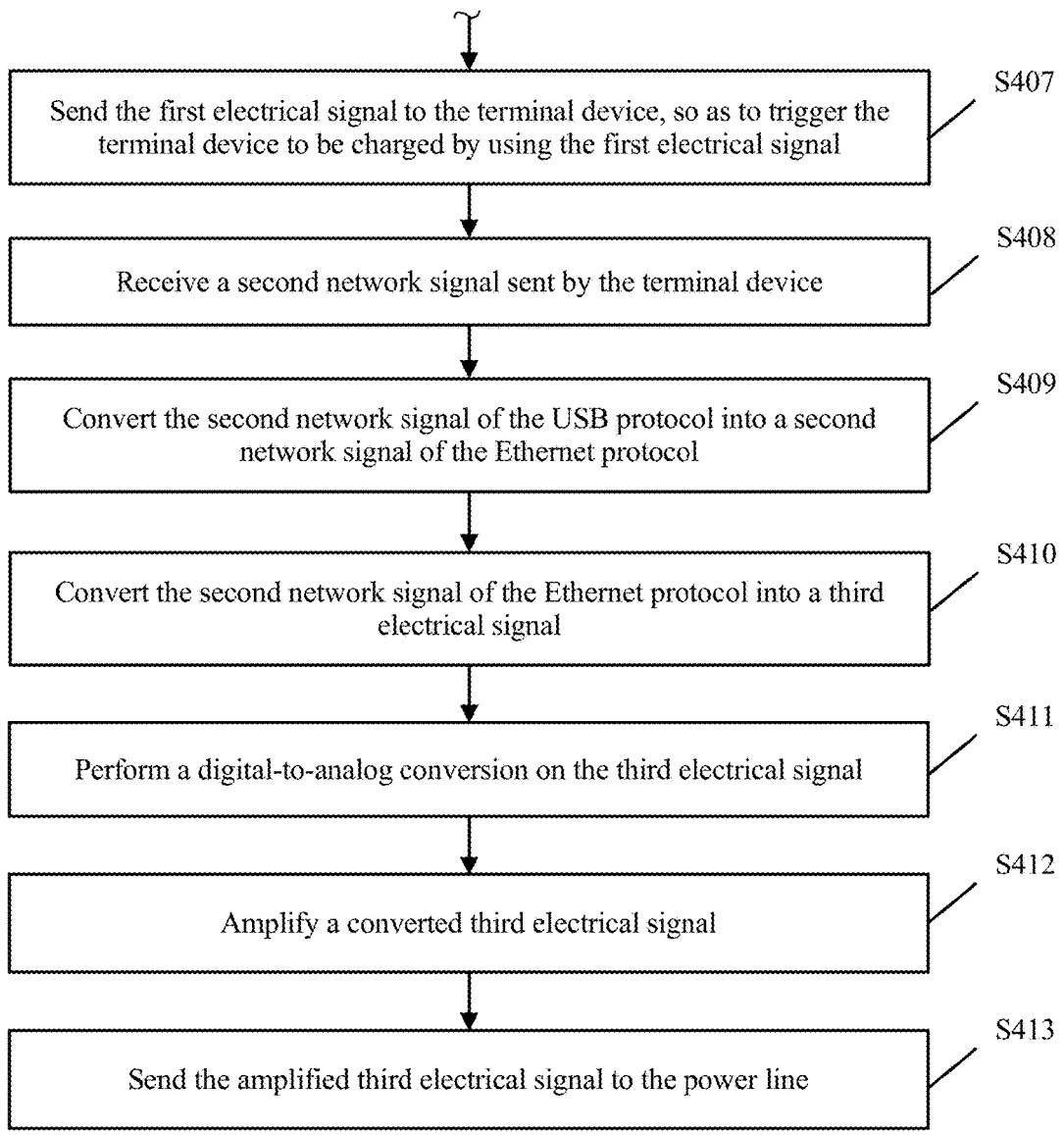

Referring to FIG. 4A and FIG. 4B, FIG. 4A and FIG. 4B are a flowchart of another power line communication method according to an embodiment of the present invention. The power line communication method is applicable to a power line communications device, such as a power line communication modem. As shown in FIG. 4A and FIG. 4B, the power line communication method may include the following steps.

S401. Receive a first electrical signal sent by a power line.

In this embodiment, the power line communications device is connected to the power line by using a socket or in another manner, the power line communications device is provided with a USB interface, and the USB interface is connected to a terminal device by using a data cable. When a user needs to access a network by using the terminal device, the user may enable a function, of the terminal device, for accessing a network by using the power line communications device, and then the power line communications device receives the first electrical signal sent by the power line.

S402. Obtain, from the first electrical signal, a second electrical signal in a preset frequency band.

In this embodiment, the second electrical signal in the preset frequency band is loaded into the first electrical signal, and therefore the second electrical signal in the preset frequency band is obtained from the first electrical signal after the first electrical signal is received.

S403. Perform an analog-to-digital conversion on the second electrical signal.

In this embodiment, the electrical signal transmitted by the power line is an analog electrical signal, and therefore the second electrical signal is converted from the analog electrical signal to a digital electrical signal.

S404. Convert a converted second electrical signal into a first network signal.

In this embodiment, after the converted second electrical signal is obtained, the converted second electrical signal is converted into the first network signal of an Ethernet protocol.

S405. Convert the first network signal of an Ethernet protocol into a first network signal of a USB protocol.

In this embodiment, the power line communications device is connected to the terminal device by using the USB interface, and the USB interface can only transmit a network signal of the USB protocol, but cannot transmit a network signal of the Ethernet protocol. Therefore, the first network signal of the Ethernet protocol is converted into the first network signal of the USB protocol.

S406. Send the first network signal of the USB protocol to a terminal device, so as to trigger the terminal device to access a network by using the first network signal of the USB protocol.

In this embodiment, after the first network signal of the USB protocol is obtained, the first network signal of the USB protocol is sent to the terminal device by using the USB interface, so that the terminal device can access the network by using the network signal.

S407. Send the first electrical signal to the terminal device, so as to trigger the terminal device to be charged by using the first electrical signal.

In this embodiment, the power line communications device not only can obtain the second electrical signal from the first electrical signal sent by the power line, convert the second electrical signal into the network signal, and send the network signal to the terminal device, so that the terminal device accesses the network, but also can send the terminal device the first electrical signal sent by the power line, so that the terminal device charges a battery of the terminal device by using the first electrical signal.

S408. Receive a second network signal sent by the terminal device.

In this embodiment, when the user needs to share a network by using the terminal device, the user may enable a function, of the terminal device, for sharing a network by using the power line communications device, the terminal device sends a network signal to the power line communications device, and the power line communications device receives the network signal sent by the terminal device.

S409. Convert the second network signal of the USB protocol into a second network signal of the Ethernet protocol.

In this embodiment, after receiving the network signal sent by the terminal device, the power line communications device converts the network signal from the network signal of the USB protocol into the network signal of the Ethernet protocol.

S410. Convert the second network signal of the Ethernet protocol into a third electrical signal.

In this embodiment, the network signal is to be shared by using the power line, and therefore the network signal of the Ethernet protocol needs to be converted into the electrical signal.

S411. Perform a digital-to-analog conversion on the third electrical signal.

In this embodiment, the power line transmits only an analog electrical signal, and therefore the electrical signal is converted from a digital electrical signal to an analog electrical signal.

S412. Amplify a converted third electrical signal.

In this embodiment, after the analog electrical signal is obtained, the analog electrical signal is amplified, so as to obtain a needed electrical signal.

S413. Send the amplified third electrical signal to the power line.

In this embodiment, after the amplified electrical signal is obtained, the amplified electrical signal is loaded into the power line, so as to transmit the electrical signal to another power line communications device by using the power line.

In the power line communication method described in FIG. 4A and FIG. 4B, an electrical signal sent by a power line maybe received, an electrical signal in a preset frequency band is obtained from the electrical signal, the electrical signal is converted into a network signal of an Ethernet protocol, then the network signal of the Ethernet protocol is converted into a network signal of a USB protocol, and the network signal of the USB protocol is sent to a terminal device; that is, the received electrical signal sent by the power line may be converted into the network signal of the USB protocol, and the network signal of the USB protocol is sent to the terminal device by using a USB interface. Alternatively, a network signal of a USB protocol sent by a terminal device maybe received, the network signal of the USB protocol is converted into a network signal of an Ethernet protocol, then the network signal of the Ethernet protocol is converted into an electrical signal, and the electrical signal is loaded into a power line; that is, the network signal of the terminal device may be received by using a USB interface, the network signal is converted into the electrical signal, and the electrical signal is loaded into the power line.

Figure 5:
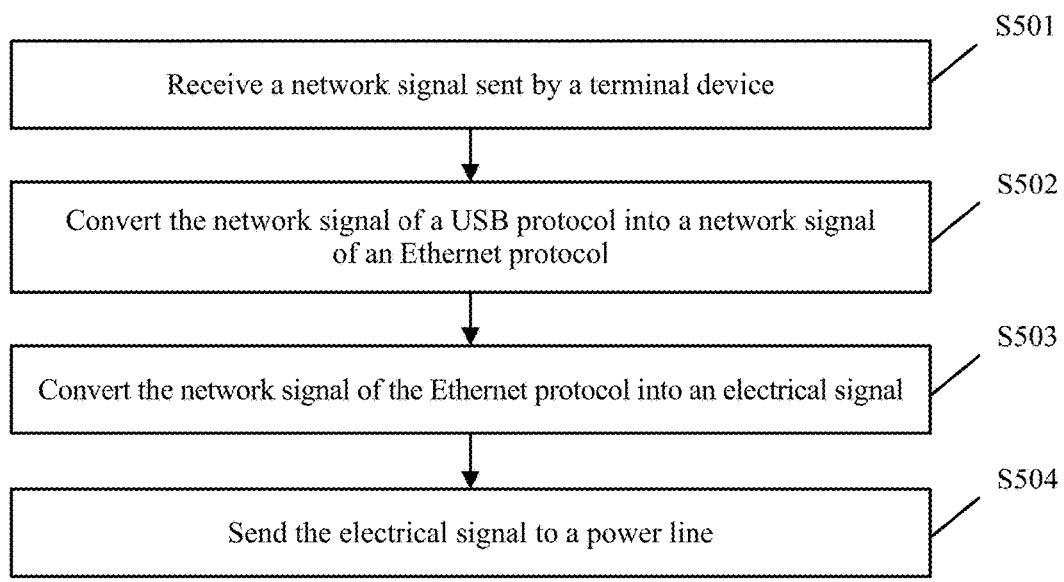
FIG. 5 is a flowchart of still another power line communication method according to an embodiment of the present invention.

Referring to FIG. 5, FIG. 5 is a flowchart of still another power line communication method according to an embodiment of the present invention. The power line communication method is applicable to a power line communications device, such as a power line communication modem. As shown in FIG. 5, the power line communication method may include the following steps.

S501. Receive a network signal sent by a terminal device.

In this embodiment, the power line communications device is connected to a power line by using a socket or in another manner, the power line communications device is provided with a USB interface, and the USB interface is connected to a terminal device by using a data cable. When a user needs to share a network by using the terminal device, the user may enable a function, of the terminal device, for sharing a network by using the power line communications device, the terminal device sends a network signal to the power line communications device, and the power line communications device receives the network signal sent by the terminal device.

S502. Convert the network signal of a USB protocol into a network signal of an Ethernet protocol.

In this embodiment, after receiving the network signal sent by the terminal device, the power line communications device converts the network signal from the network signal of the USB protocol into the network signal of the Ethernet protocol.

S503. Convert the network signal of the Ethernet protocol into an electrical signal.

In this embodiment, the network signal is to be shared by using the power line, and therefore the network signal of the Ethernet protocol needs to be converted into the electrical signal.

S504. Send the electrical signal to a power line.

In this embodiment, after the electrical signal is obtained, the electrical signal is loaded into the power line, so as to transmit the electrical signal to another power line communications device by using the power line.

In the power line communication method described in FIG. 5, a network signal of a USB protocol sent by a terminal device may be received, the network signal of the USB protocol is converted into a network signal of an Ethernet protocol, then the network signal of the Ethernet protocol is converted into an electrical signal, and the electrical signal is loaded into a power line. That is, the network signal of the terminal device maybe received by using a USB interface, the network signal is converted into the electrical signal, and the electrical signal is loaded into the power line.

Figure 6A:
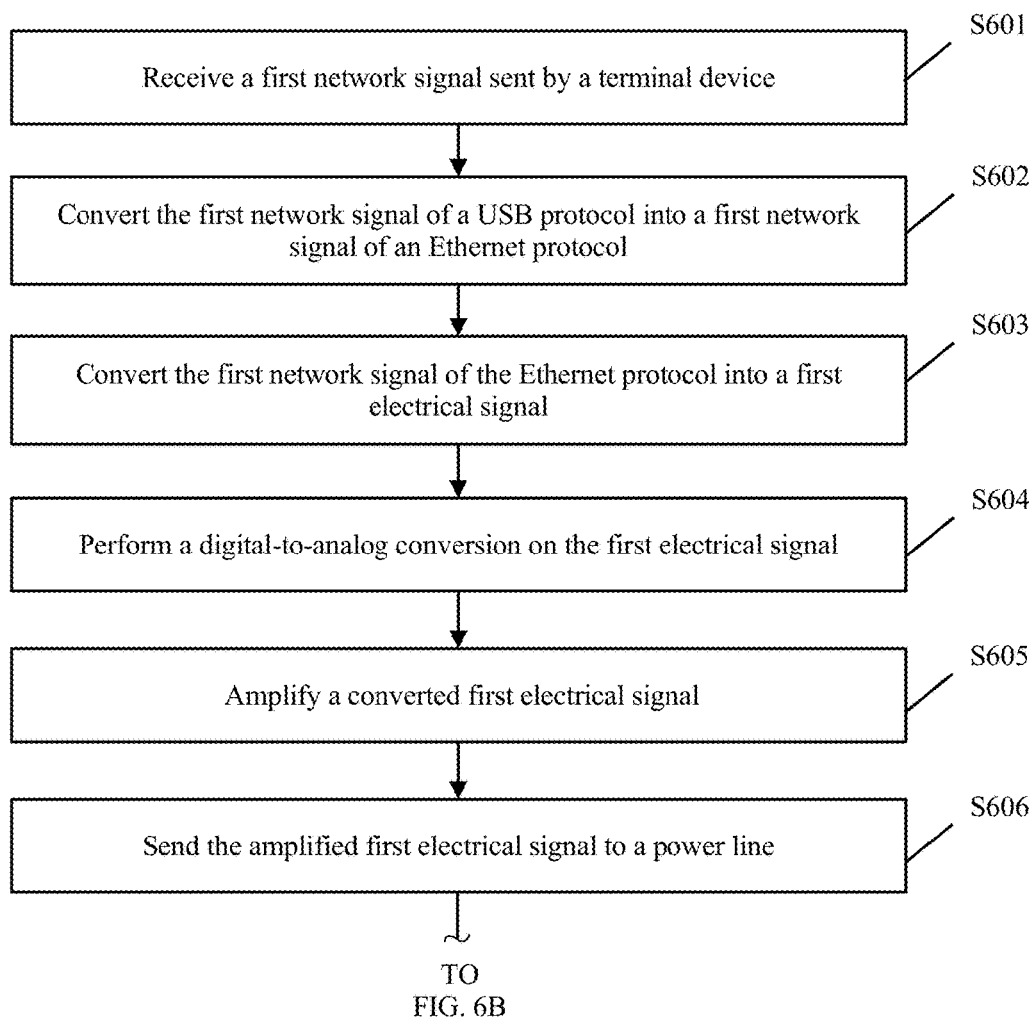
FIG. 6A and FIG. 6B are a flowchart of still another power line communication method according to an embodiment of the present invention.
Figure 6B:
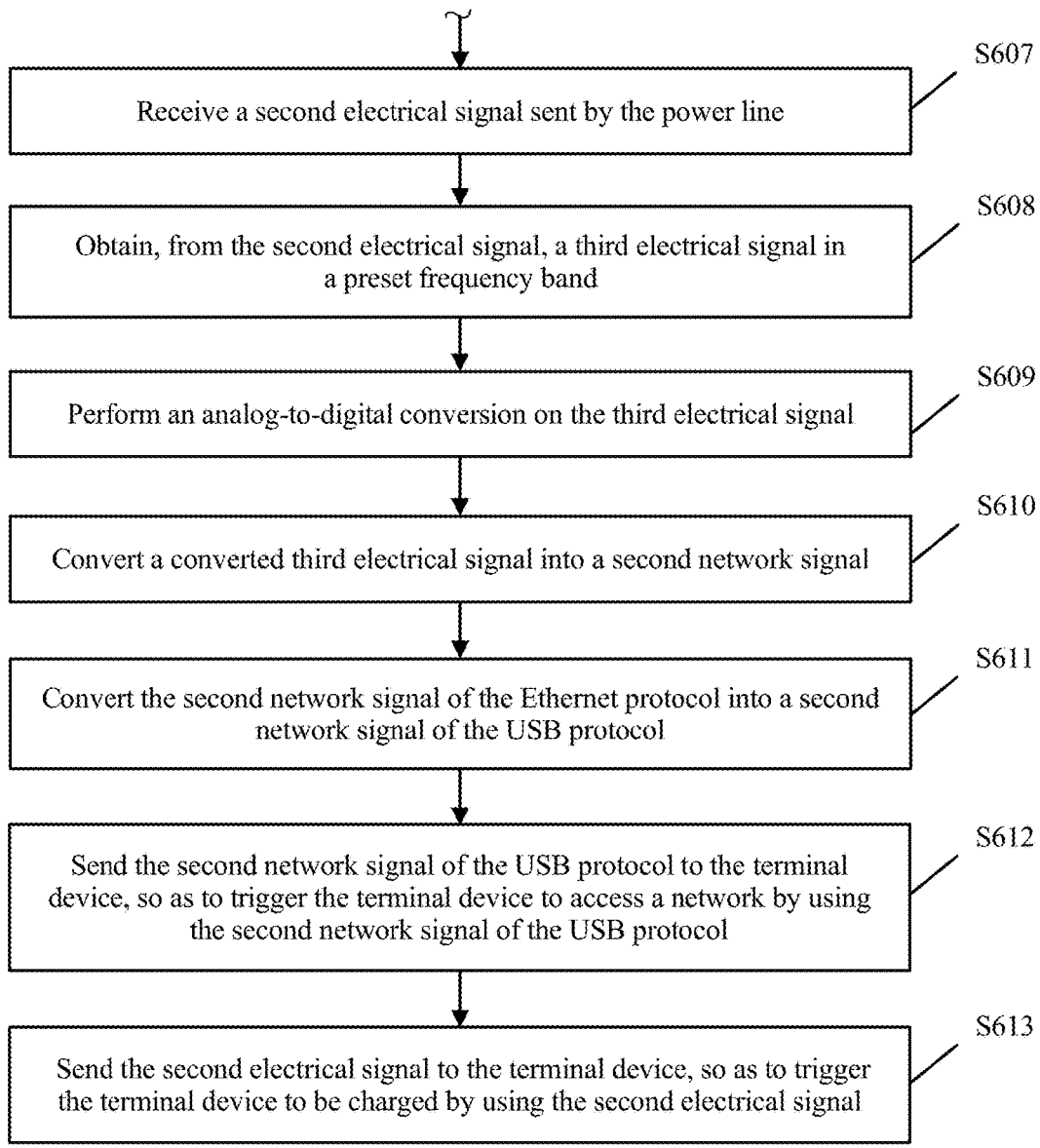

Referring to FIG. 6A and FIG. 6B, FIG. 6A and FIG. 6B are a flowchart of still another power line communication method according to an embodiment of the present invention. The power line communication method is applicable to a power line communications device, such as a power line communication modem. As shown in FIG. 6A and FIG. 6B, the power line communication method may include the following steps.

S601. Receive a first network signal sent by a terminal device.

In this embodiment, the power line communications device is connected to a power line by using a socket or in another manner, the power line communications device is provided with a USB interface, and the USB interface is connected to a terminal device by using a data cable. When a user needs to share a network by using the terminal device, the user may enable a function, of the terminal device, for sharing a network by using the power line communications device, the terminal device sends a network signal to the power line communications device, and the power line communications device receives the network signal sent by the terminal device.

S602. Convert the first network signal of a USB protocol into a first network signal of an Ethernet protocol.

In this embodiment, after receiving the network signal sent by the terminal device, the power line communications device converts the network signal from the network signal of the USB protocol into the network signal of the Ethernet protocol.

S603. Convert the first network signal of the Ethernet protocol into a first electrical signal.

In this embodiment, the network signal is to be shared by using the power line, and therefore the network signal of the Ethernet protocol needs to be converted into the electrical signal.

S604. Perform a digital-to-analog conversion on the first electrical signal.

In this embodiment, the power line transmits only an analog electrical signal, and therefore the electrical signal is converted from a digital electrical signal to an analog electrical signal.

S605. Amplify a converted first electrical signal.

In this embodiment, after the analog electrical signal is obtained, the analog electrical signal is amplified, so as to obtain a needed electrical signal.

S606. Send the amplified first electrical signal to a power line.

In this embodiment, after the amplified electrical signal is obtained, the amplified electrical signal is loaded into the power line, so as to transmit the electrical signal to another power line communications device by using the power line.

S607. Receive a second electrical signal sent by the power line.

In this embodiment, when the user needs to access a network by using the terminal device, the user may enable a function, of the terminal device, for accessing a network by using the power line communications device, and then the power line communications device receives the second electrical signal sent by the power line.

S608. Obtain, from the second electrical signal, a third electrical signal in a preset frequency band.

In this embodiment, the third electrical signal in the preset frequency band is loaded into the second electrical signal, and therefore the third electrical signal in the preset frequency band is obtained from the second electrical signal after the second electrical signal is received.

S609. Perform an analog-to-digital conversion on the third electrical signal.

In this embodiment, the electrical signal transmitted by the power line is an analog electrical signal, and therefore the second electrical signal is converted from the analog electrical signal to a digital electrical signal.

S610. Convert a converted third electrical signal into a second network signal.

In this embodiment, after the converted second electrical signal is obtained, the converted second electrical signal is converted into the first network signal of the Ethernet protocol.

S611. Convert the second network signal of the Ethernet protocol into a second network signal of the USB protocol.

In this embodiment, the power line communications device is connected to the terminal device by using the USB interface, and the USB interface can only transmit a network signal of the USB protocol, but cannot transmit a network signal of the Ethernet protocol. Therefore, the second network signal of the Ethernet protocol is converted into the second network signal of the USB protocol.

S612. Send the second network signal of the USB protocol to the terminal device, so as to trigger the terminal device to access a network by using the second network signal of the USB protocol.

In this embodiment, after the second network signal of the USB protocol is obtained, the second network signal of the USB protocol is sent to the terminal device by using the USB interface, so that the terminal device can access the network by using the network signal.

S613. Send the second electrical signal to the terminal device, so as to trigger the terminal device to be charged by using the second electrical signal.

In this embodiment, the power line communications device not only can obtain the third electrical signal from the second electrical signal sent by the power line, convert the third electrical signal into the network signal, and send the network signal to the terminal device, so that the terminal device accesses the network, but also can send the terminal device the second electrical signal sent by the power line, so that the terminal device charges a battery of the terminal device by using the second electrical signal.

In the power line communication method described in FIG. 6A and FIG. 6B, a network signal of a USB protocol sent by a terminal device may be received, the network signal of the USB protocol is converted into a network signal of an Ethernet protocol, then the network signal of the Ethernet protocol is converted into an electrical signal, and the electrical signal is loaded into a power line; that is, the network signal of the terminal device may be received by using a USB interface, the network signal is converted into the electrical signal, and the electrical signal is loaded into the power line. Alternatively, an electrical signal sent by a power line maybe received, an electrical signal in a preset frequency band is obtained from the electrical signal, the electrical signal is converted into a network signal of an Ethernet protocol, then the network signal of the Ethernet protocol is converted into a network signal of a USB protocol, and the network signal of the USB protocol is sent to a terminal device; that is, the received electrical signal sent by the power line may be converted into the network signal of the USB protocol, and the network signal of the USB protocol is sent to the terminal device by using a USB interface.

A person of ordinary skill in the art may understand that all or some of the steps of the methods in the embodiments may be implemented by a program instructing relevant hardware. The program maybe stored in a computer readable storage medium. The storage medium may include a flash memory, a read-only memory (Read-Only Memory, ROM), a random access memory (Random Access Memory, RAM), a magnetic disk, and an optical disc.

The power line communication method and device disclosed in the embodiments of the present invention are described in detail above. The principles and implementation manners of the present invention are described in this specification by using specific examples. The description of the embodiments is merely intended to help understand the method and core ideas of the present invention. In addition, a person of ordinary skill in the art may make modifications to the present invention with respect to the specific implementation manners and application scopes according to the ideas of the present invention. Therefore, the content of this specification shall not be construed as a limitation on the present invention.

The invention claimed is:

1. A power line communications device, comprising:
a Universal Serial Bus (USB) interface, a protocol conversion module, a first signal conversion module, a coupler, and a power line interface, wherein:
a first end of the USB interface is connected to a first end of the protocol conversion module, a second end of the protocol conversion module is connected to a first end of the first signal conversion module, a second end of the first signal conversion module is connected to a first end of the coupler, and a second end of the coupler is connected to a first end of the power line interface;
the power line interface is configured to:
connect to a power line, receive a first electrical signal sent by the power line, and send the first electrical signal to the coupler;
the coupler is configured to:
obtain a second electrical signal from the first electrical signal, and send the second electrical signal to the first signal conversion module, wherein the second electrical signal is an electrical signal in a preset frequency band;
the first signal conversion module is configured to:
convert the second electrical signal into a first network signal, and send the first network signal to the protocol conversion module;
the protocol conversion module is configured to:
convert the first network signal of an Ethernet protocol into a first network signal of a USB protocol, and send the converted first network signal to the USB interface; and
the USB interface is configured to:
connect to a terminal device by using a data cable, and send the converted first network signal to the terminal device for triggering the terminal device to access a network by using the converted first network signal.

2. The power line communications device according to claim 1, comprising:
a second signal conversion module having a first end connected to the second end of the first signal conversion module and having a second end connected to the first end of the coupler, and wherein the second signal conversion module is configured to:
receive the second electrical signal sent by the coupler;
convert the second electrical signal from an analog signal into a digital signal; and
send the converted second electrical signal to the first signal conversion module.

3. The power line communications device according to claim 2, wherein:
the USB interface is further configured to:
receive a second network signal sent by the terminal device by using the data cable, and send the second network signal to the protocol conversion module;
the protocol conversion module is further configured to:
convert the second network signal of the USB protocol into a second network signal of the Ethernet protocol, and send the converted second network signal to the first signal conversion module;
the first signal conversion module is further configured to:
convert the converted second network signal into a third electrical signal, and send the third electrical signal to the second signal conversion module;
the second signal conversion module is further configured to:
convert the third electrical signal from a digital signal into an analog signal, and send the converted third electrical signal to the coupler;
the coupler is further configured to:
send the converted third electrical signal to the power line interface; and
the power line interface is further configured to:
send the converted third electrical signal to the power line.

4. The power line communications device according to claim 3, further comprising:
an amplifier having a first end connected to a third end of the second signal conversion module and having a second end connected to a third end of the coupler, wherein the amplifier is configured to:
receive the converted third electrical signal sent by the second signal conversion module;
amplify the converted third electrical signal; and
send the amplified third electrical signal to the coupler.

5. The power line communications device according to claim 1, wherein:
the power line communications device further comprises a power supply module having a first end connected to a second end of the power line interface and having a second end connected to a second end of the USB interface, and wherein the power supply module is configured to:
receive the first electrical signal sent by the power line interface, and
send the first electrical signal to the USB interface; and
the USB interface is further configured to:
send the first electrical signal to the terminal device by using the data cable for triggering the terminal device to be charged by using the first electrical signal.

6. A power line communications device, comprising:
a Universal Serial Bus (USB) interface, a protocol conversion module, a first signal conversion module, a second signal conversion module, an amplifier, a coupler, and a power line interface, wherein:
a first end of the USB interface is connected to a first end of the protocol conversion module, a second end of the protocol conversion module is connected to a first end of the first signal conversion module, a second end of the first signal conversion module is connected to a first end of the coupler, and a second end of the coupler is connected to a first end of the power line interface;
the USB interface is configured to:
connect to a terminal device by using a data cable, receive a first network signal sent by the terminal device, and send the first network signal to the protocol conversion module;
the protocol conversion module is configured to:
convert the first network signal of a USB protocol into a first network signal of an Ethernet protocol, and send the converted first network signal to the first signal conversion module;
the first signal conversion module is configured to:
convert the converted first network signal into a first electrical signal, and send the first electrical signal to the coupler;
the coupler is configured to send the first electrical signal to the power line interface;
the power line interface is configured to:
connect to a power line, and send the first electrical signal to the power line;
a first end of the second signal conversion module is connected to the second end of the first signal conversion module and a second end of the second signal conversion module is connected to the first end of the coupler, wherein the second signal conversion module is configured to:
receive the first electrical signal sent by the first signal conversion module;
convert the first electrical signal from a digital signal into an analog signal; and
send the converted first electrical signal to the coupler;
a first end of the amplifier is connected to a third end of the second signal conversion module and a second end of the amplifier is connected to a third end of the coupler, wherein the amplifier is configured to:
receive the converted first electrical signal sent by the second signal conversion module;
amplify the converted first electrical signal; and
send the amplified first electrical signal to the coupler.

7. A power line communications device, comprising:
a Universal Serial Bus (USB) interface, a protocol conversion module, a first signal conversion module, a second signal conversion module, a coupler, and a power line interface, wherein:
a first end of the USB interface is connected to a first end of the protocol conversion module, a second end of the protocol conversion module is connected to a first end of the first signal conversion module, a second end of the first signal conversion module is connected to a first end of the coupler, and a second end of the coupler is connected to a first end of the power line interface;
the USB interface is configured to:
connect to a terminal device by using a data cable, receive a first network signal sent by the terminal device, and send the first network signal to the protocol conversion module;
the protocol conversion module is configured to:
convert the first network signal of a USB protocol into a first network signal of an Ethernet protocol, and send the converted first network signal to the first signal conversion module;

the first signal conversion module is configured to:
convert the converted first network signal into a first electrical signal, and send the first electrical signal to the coupler;

the coupler is configured to send the first electrical signal to the power line interface;

the power line interface is configured to:
connect to a power line, and send the first electrical signal to the power line;

a first end of the second signal conversion module is connected to the second end of the first signal conversion module and a second end of the second signal conversion module is connected to the first end of the coupler, wherein the second signal conversion module is configured to:
receive the first electrical signal sent by the first signal conversion module;
convert the first electrical signal from a digital signal into an analog signal; and
send the converted first electrical signal to the coupler;

the power line interface is further configured to:
receive a second electrical signal sent by the power line, and send the second electrical signal to the coupler;

the coupler is further configured to:
obtain a third electrical signal from the second electrical signal, and send the third electrical signal to the second signal conversion module, wherein the third electrical signal is an electrical signal in a preset frequency band;

the second signal conversion module is further configured to:
convert the third electrical signal from an analog signal into a digital signal, and send the converted third electrical signal to the first signal conversion module;

the first signal conversion module is further configured to:
convert the converted third electrical signal into a second network signal, and send the second network signal to the protocol conversion module;

the protocol conversion module is further configured to:
convert the second network signal of the Ethernet protocol into a second network signal of the USB protocol, and send the converted second network signal to the USB interface; and the USB interface is further configured to:
send the second network signal of the USB protocol to the terminal device for triggering the terminal device to access a network by using the second network signal of the USB protocol.

8. The power line communications device according to claim 7, wherein:
the power line communications device further comprises a power supply module having a first end connected to a second end of the power line interface and having a second end connected to a second end of the USB interface, wherein the power supply module is configured to:

receive a second electrical signal sent by the power line interface, and
send the second electrical signal to the USB interface; and the USB interface is further configured to:
send the second electrical signal to the terminal device by using the data cable for triggering the terminal device to be charged by using the second electrical signal.

9. A power line communication method, comprising:
receiving a first electrical signal sent by a power line;
obtaining, from the first electrical signal, a second electrical signal in a preset frequency band;
converting the second electrical signal into a first network signal;
converting the first network signal of an Ethernet protocol into a first network signal of a Universal Serial Bus (USB) protocol; and
sending the first network signal of the USB protocol to the terminal device for triggering the terminal device to access a network by using the first network signal of the USB protocol.

10. The method according to claim 9, wherein:
after obtaining, from the first electrical signal, a second electrical signal in a preset frequency band, and before converting the second electrical signal into a first network signal, the method further comprises:
performing an analog-to-digital conversion on the second electrical signal; and
converting the second electrical signal into a first network signal comprises:
converting a converted second electrical signal into the first network signal.

11. The method according to claim 10, further comprising:
receiving a second network signal sent by the terminal device;
converting the second network signal of the USB protocol into a second network signal of the Ethernet protocol;
converting the second network signal of the Ethernet protocol into a third electrical signal;
performing a digital-to-analog conversion on the third electrical signal; and
sending a converted third electrical signal to the power line.

12. The method according to claim 11, wherein:
after performing a digital-to-analog conversion on the third electrical signal, and before sending a converted third electrical signal to the power line, the method further comprises:
amplifying the converted third electrical signal; and
sending a converted third electrical signal to the power line comprises:
sending the amplified third electrical signal to the power line.

13. The method according to claim 9, further comprising:
sending the first electrical signal to the terminal device for triggering the terminal device to be charged by using the first electrical signal.

\* \* \* \* \*